United States Patent
Lambrache et al.

(10) Patent No.: US 7,304,890 B2
(45) Date of Patent: Dec. 4, 2007

(54) DOUBLE BYTE SELECT HIGH VOLTAGE LINE FOR EEPROM MEMORY BLOCK

(75) Inventors: Emil Lambrache, Campbell, CA (US); Duncan Curry, Sunnyvale, CA (US); Richard F. Pang, Milpitas, CA (US)

(73) Assignee: Atmel Corporation, San Jose, CA (US)

( * ) Notice: Subject to any disclaimer, the term of this patent is extended or adjusted under 35 U.S.C. 154(b) by 10 days.

(21) Appl. No.: 11/301,401

(22) Filed: Dec. 13, 2005

(65) Prior Publication Data
US 2007/0171756 A1 Jul. 26, 2007

(51) Int. Cl.
*G11C 11/34* (2006.01)

(52) U.S. Cl. ............... 365/185.12; 365/238.05; 365/185.23

(58) Field of Classification Search ........... 365/238.05, 365/230.06, 185.12, 185.23
See application file for complete search history.

(56) References Cited

U.S. PATENT DOCUMENTS

| | | | | |
|---|---|---|---|---|
| 5,237,535 A * | 8/1993 | Mielke et al. | ........... | 365/185.3 |
| 5,715,194 A * | 2/1998 | Hu | ........... | 365/185.17 |
| 5,748,538 A * | 5/1998 | Lee et al. | ........... | 365/185.06 |
| 5,822,252 A * | 10/1998 | Lee et al. | ........... | 365/185.3 |
| 5,848,000 A * | 12/1998 | Lee et al. | ........... | 365/185.23 |
| 5,940,315 A * | 8/1999 | Cowles | ........... | 365/51 |
| 5,970,016 A * | 10/1999 | Ohsawa | ........... | 365/230.03 |
| 6,072,722 A * | 6/2000 | Hirano | ........... | 365/185.13 |
| 6,101,123 A * | 8/2000 | Kato et al. | ........... | 365/185.11 |
| 6,252,798 B1 * | 6/2001 | Satoh et al. | ........... | 365/185.02 |
| 6,404,692 B1 * | 6/2002 | Takita et al. | ........... | 365/230.03 |
| 6,498,752 B1 * | 12/2002 | Hsu et al. | ........... | 365/185.22 |
| 6,777,292 B2 * | 8/2004 | Lee et al. | ........... | 438/257 |
| 6,933,557 B2 * | 8/2005 | Lojek | ........... | 257/315 |
| 6,967,874 B2 * | 11/2005 | Hosono | ........... | 365/185.33 |
| 7,161,842 B2 * | 1/2007 | Park | ........... | 365/185.33 |
| 7,164,602 B2 * | 1/2007 | Hamamoto et al. | ........... | 365/185.09 |

* cited by examiner

*Primary Examiner*—Richard T. Elms
*Assistant Examiner*—Han Yang
(74) *Attorney, Agent, or Firm*—Schneck & Schneck; Thomas Schneck

(57) ABSTRACT

A byte select circuit of a memory cell array wherein each column of the memory cell array has two byte select lines. A first byte select line is coupled to the even numbered rows in the column and a second byte select line is coupled to the odd numbered rows in the column. The second byte select line is configured to be driven to a low voltage level when the first byte select line is driven to a high voltage level, thereby minimizing or eliminating any parasitic voltage coupling between adjacent rows of memory cells.

13 Claims, 3 Drawing Sheets

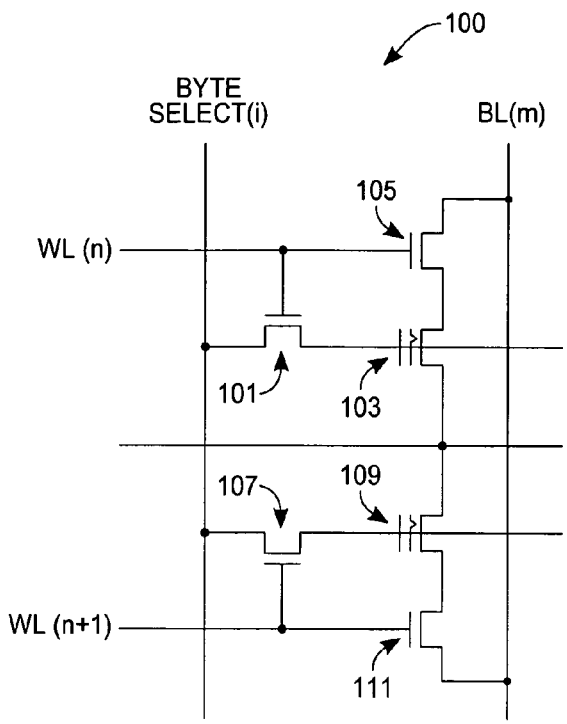
Fig._1
(Prior Art)
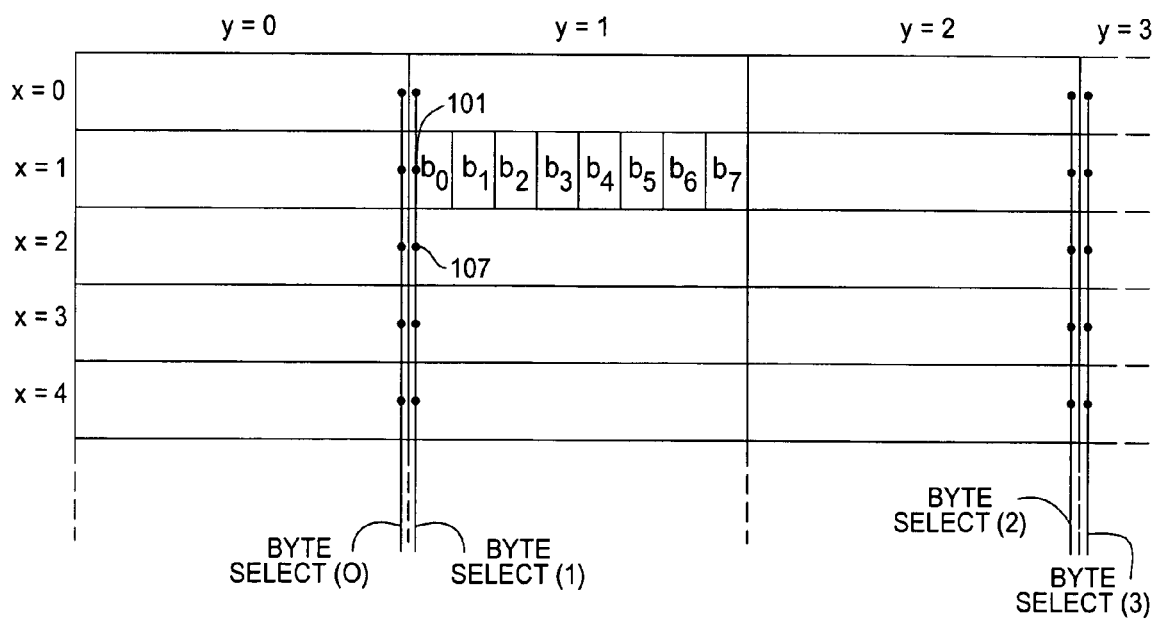
Fig._2
(Prior Art)

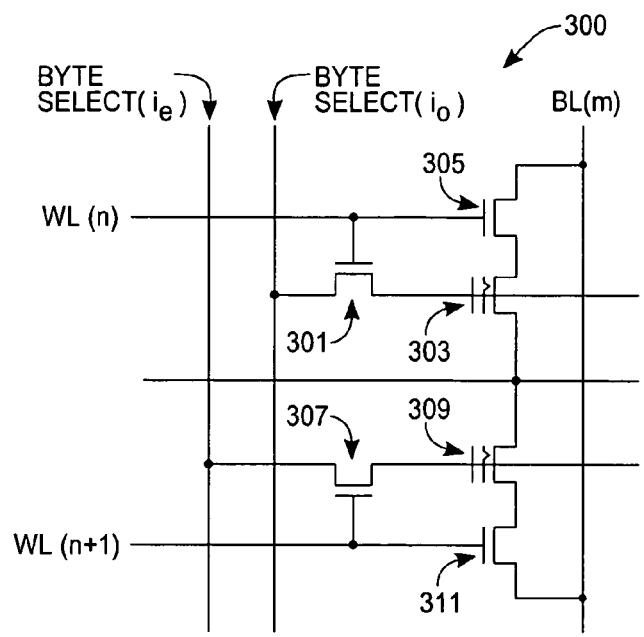
Fig._3
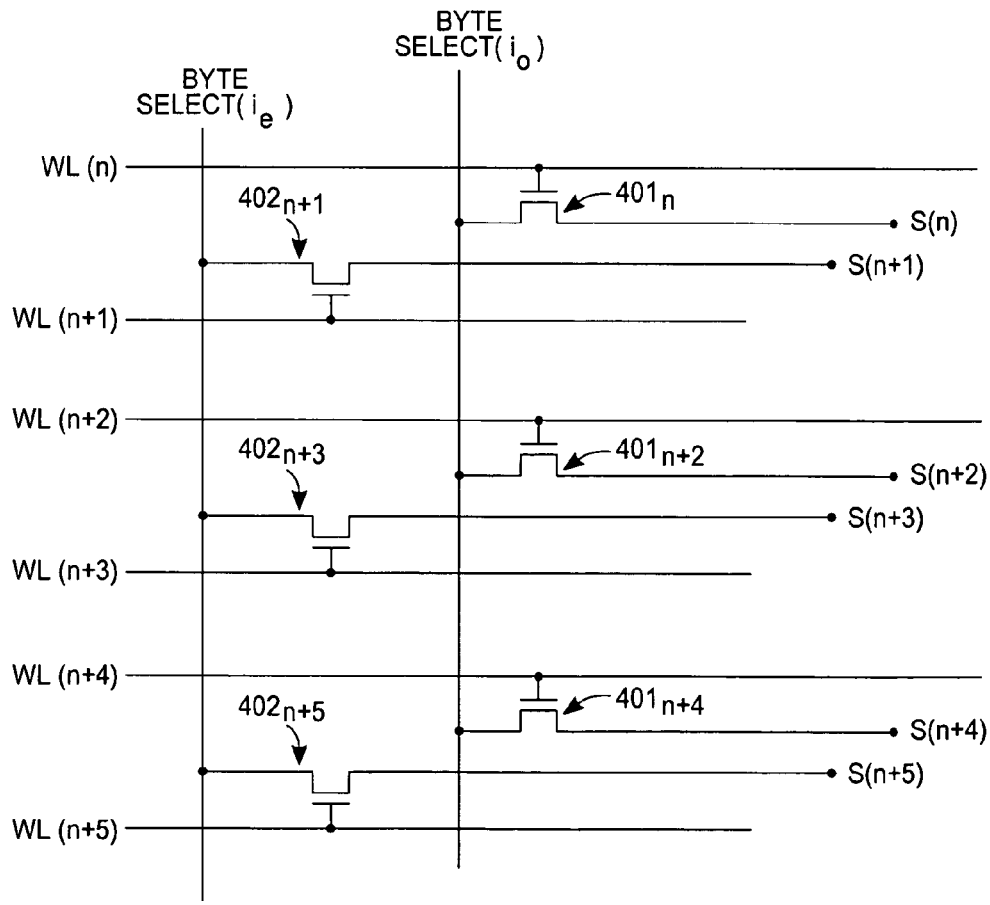
Fig._4

DOUBLE BYTE SELECT HIGH VOLTAGE LINE FOR EEPROM MEMORY BLOCK

TECHNICAL FIELD

The present invention relates generally to a non-volatile memory architecture. More specifically, the present invention is an EEPROM non-volatile memory architecture providing multiple byte select lines to alternating word line rows.

BACKGROUND ART

EEPROM arrays include floating-gate memory cells arranged in rows and columns. When a floating gate of a programmed memory cell is charged with electrons, a source-drain path under the charged floating gate is nonconductive when a wordline select voltage is applied to a control gate of the cell. A nonconductive state is read as a "1" bit. If the floating gate of a non-programmed cell is either positively charged, neutrally charged, or slightly negatively charged, the source-drain path under the non-programmed floating gate is conductive when the wordline select voltage is applied to the control gate. The conductive state is read as a "0" bit.

In memories based on a Fowler-Nordheim tunneling mechanism, an oxide between a floating gate of a transistor and a drain of the transistor must be fabricated to be very thin, typically only a few nanometers thick. When a voltage is applied across the control gate (to which the floating gate is strongly capacitively coupled) and the drain, a strong electrical field is produced. Electrons can then tunnel from the drain region via the thin oxide to the floating gate. A tunneling current in the opposite direction can be obtained by reversing the field. Thus, it is possible to write and erase a cell.

Each column and row of an EEPROM array may contain thousands of cells. Control gates of each cell in a row are connected to a wordline. Prior to first programming, the source-drain paths of the cells begin to conduct at a relatively uniform control-gate threshold voltage, $V_t$, since the floating gates are neutrally charged (having neither an excess nor a deficiency of electrons). An initial uniform threshold voltage may be, for example, +2.5 volts between the control gate and the source terminal. The initial uniform threshold voltage may be adjusted by appropriately doping the channel regions of the cells during fabrication.

After programming, source-drain paths of the programmed cells have control-gate threshold voltages distributed over a voltage range, typically between −3.5 volts to −0.5 volts. After electrical erasure of the cells, the threshold voltages of the erased cells may be distributed over a range from perhaps +0.5 to 3.5 volts with a majority of the cells having erased threshold voltages near 2.5 volts. The actual range of erased threshold voltages is dependent on factors such as localized variations in the tunnel oxide thickness, geometrical areas of tunneling regions, capacitive coupling ratios between wordlines and floating gates, and relative strengths of erasing pulses. Using a lower-strength erasing pulse, the erased threshold voltage range may be from perhaps +1.5 to +3.5 volts with a majority of the cells having erased threshold voltages near 2.5 volts. With a higher-strength erasing pulse applied, the distribution may range from perhaps +3.0 to +6 volts with a majority of cells having erased threshold voltages near +4.5 volt. An excess of positive charges on the floating gates causes channel regions under the gates of floating gate transistors to be enhanced with electrons.

In general, an extent of channel doping, programming pulse strength, erasing pulse strength, and other factors are chosen such that the source-drain path of a cell will either be conductive or non-conductive when applying a wordline select voltage to the control gate.

With reference to FIG. 1, a portion 100 of a prior art memory array includes a first byte select transistor 101 connected to a gate of a first floating gate transistor 103. A first wordline, WL(n), is connected to gates of both the first byte select transistor 101 and a first bit select transistor 105. An asserted high value (e.g., a logical "1") on the wordline, WL(n) allows both the first byte select transistor 101 and the first bit select transistor 105 to conduct, thereby allowing the first floating gate transistor 103 to be selected for read, write, or programming operations through a bitline, BL(m). The asserted high value on the wordline, WL(n), allows a source-drain current to flow from a byte select (i) line to a control gate of the first floating gate transistor 103. The byte select (i) line is also arranged with seven additional floating gate transistors (not shown) in parallel with the first floating gate transistor 103 to store a byte of data. The portion 100 of the prior art memory array also includes a second byte select transistor 107, a second floating gate transistor 109, and a second bit select transistor 111. A gate of the second bit select transistor 111 is connected to a second wordline, WL(n+1), and seven other floating gate transistors (not shown) in parallel with the second floating gate transistor 109. The second floating gate transistor 109 is connected to the bitline, BL(m). Note that the first 101 and the second 107 byte select transistors are both connected to the same byte select (i) line.

In operation, when the first floating gate transistor 103 is erased, a voltage (e.g., a high voltage above $V_{cc}$ is preferred) is applied to the gate of the first byte select transistor 101 and a high voltage (e.g., 12-14 volts) is applied to the byte select (i) line, allowing electrons to transfer from a floating gate of the first floating gate transistor 103 through the mechanism of Fowler-Nordheim tunneling. However, due to the close proximity between adjacent byte select transistors 101, 107, a source-drain current on the first byte select transistor 101 may induce a source-drain current on the second byte select transistor 107 thereby causing the second floating gate transistor 109 to be inadvertently erased. Even though the length of the line from the source of, for example, the second byte select transistor 107 is very short, due to an extremely high packing density of transistors in integrated circuits, the lines are close enough that parasitic effects, such as capacitive coupling, may readily occur.

A block diagram of FIG. 2 typifies an addressable portion of a prior art memory array and exemplifies how the capacitive coupling occurs between adjacent rows of memory cells contained within the same column. For example, the first byte select transistor 101 and the first floating gate transistor 103 of FIG. 1 can be conceptualized as being located at a point $b_0$ ("bit 0") of row x=1 and column y=1 of FIG. 2. Assuming wordlines for each of the rows (x=1 through x=4 is at logic high,) byte select (1) would, when asserted, activate the first byte select transistor 101 and select each of a plurality of data bytes (e.g., bits $b_0$-$b_7$) within column y=1. Thus, rows x=1, x=2, and so on are all selected by byte select (1). Each column is thus controlled by a single byte select line (e.g., column y=0 is controlled by byte select line (0), column y=2 is controlled by byte select line (2) and so on.)

Further, adjacent byte select lines, when activated, tend to parasitically couple to a mirrored prior column. In FIG. 2, column y=0 mirrors column y=1, column y=2 mirrors column y=3, and so on. Thus, when byte select (1) in column y=1 is activated, byte select (0) may also have a voltage coupled as well.

Therefore, for robust and proper memory operation, it is desirable to eliminate or minimize any potential for parasitic cross coupling between memory cells in adjacent rows.

SUMMARY

A byte select circuit of a memory cell array wherein each column of the memory cell array has two byte select lines. A first byte select line is coupled to the even numbered rows in the column and a second byte select line is coupled to the odd numbered rows in the column. The second byte select line is configured to be driven to a low voltage level when the first byte select line is driven to a high voltage level, thereby minimizing or eliminating any parasitic voltage coupling between adjacent rows of memory cells.

In an exemplary embodiment, the present invention is a byte select circuit of an EEPROM memory cell array; the byte select circuit is arranged such that each column within the EEPROM array has two byte select lines. A first byte select line is coupled to a first plurality of memory cells in a first column of the memory cell array, the first plurality of memory cells being considered to be in an even row and selectable by a first wordline. A second byte select line is coupled to a second plurality of memory cells in the first column of the memory cell array. The second plurality of memory cells being considered to be in an odd row and selectable by a second wordline.

Any parasitic coupling is minimized or completely eliminated by this arrangement of dual byte select lines coupled with voltages placed on the wordlines. For example, the second byte select line is configured to be driven to a low voltage level when the first byte select line is driven to a high voltage level. Concurrently, any wordlines in the array that are not immediately adjacent to the first wordline are allowed to float when a voltage is asserted on the first wordline. Any wordlines immediately adjacent to the first wordline are driven to approximately zero volts when a voltage is asserted on the first wordline.

BRIEF DESCRIPTION OF THE DRAWINGS

FIG. 1 is a circuit diagram of a localized area of a prior art memory cell.

FIG. 2 is a block layout of a section of a prior art memory cell.

FIG. 3 is a circuit diagram of a localized area of an exemplary embodiment of a memory cell of the present invention.

FIG. 4 is a portion of an exemplary embodiment of an arrangement of wordline and byte select lines of the present invention.

DETAILED DESCRIPTION

Figure 5:
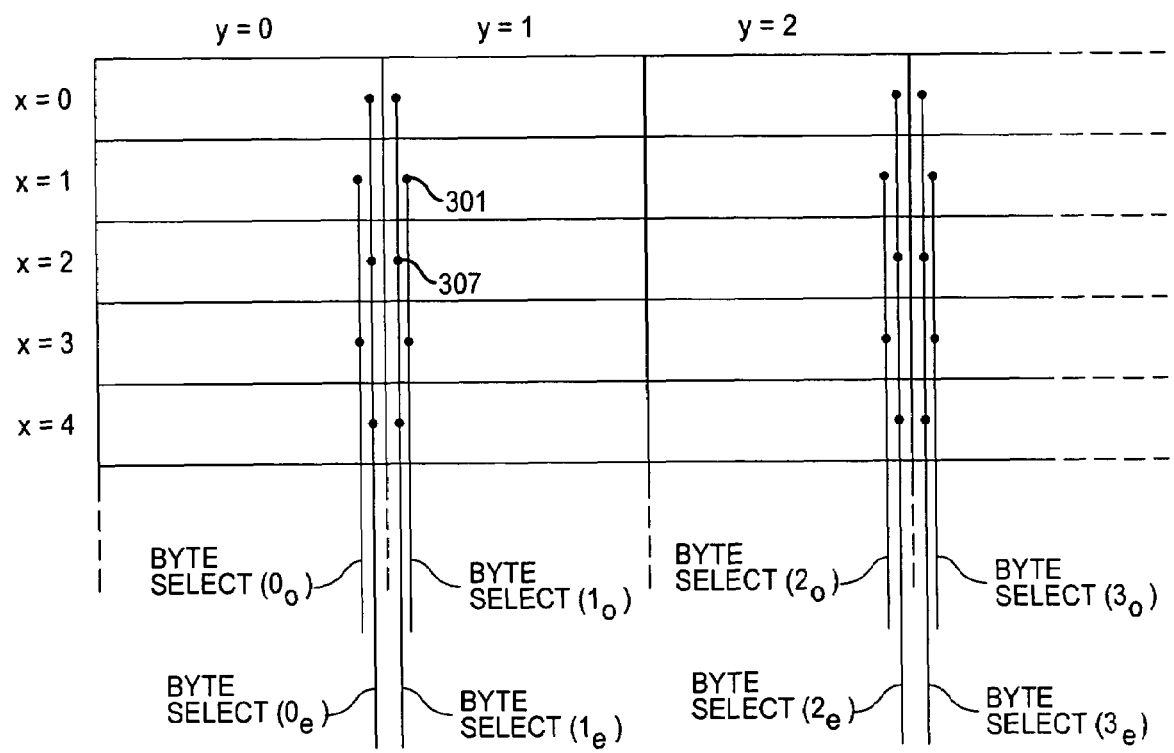
FIG. 5 is a block layout of a section of an exemplary embodiment of a memory cell incorporating the present invention.

With reference to FIG. 3, a portion 300 of an exemplary embodiment of a memory array of the present invention includes a first byte select transistor 301 coupled to a gate of a first floating gate transistor 303. A first wordline, WL(n) is coupled to gates of both the first byte select transistor 301 and a bit select transistor 305. As with the prior art, an asserted high value (e.g., a logical "1") on the wordline, WL(n) allows both the first byte select transistor 301 and the bit select transistor 305 to conduct, thereby allowing the first floating gate transistor 303 to be selected for read, write, or programming operations through a bitline, BL(m). The asserted high value on the wordline, WL(n), allows a source-drain current to flow from a byte select ($i_o$) line to a control gate of the first floating gate transistor 303. The byte select ($i_o$) line is also arranged with seven additional floating gate transistors (not shown) in parallel with the first floating gate transistor 303 to store a byte of data. The drain of the first byte select transistor 301 is coupled to an odd byte select line.

The portion 300 of the exemplary embodiment of the present invention also includes a second byte select transistor 307, a second floating gate transistor 309, and a second bit select transistor 311. A gate of the second bit select transistor 311 is coupled to a second wordline, WL(n+1). The second floating gate transistor 309 is connected to the bitline, BL(m). The drain of the second byte select transistor 307 is coupled to an even byte select line ("Byte Select ($i_e$)"). Seven other floating gate transistors (not shown) are in parallel with the second floating gate transistor 309.

Maintaining two byte select lines for each column of memory (i.e., an odd byte select line ("Byte Select ($i_o$)") and an even byte select line ("Byte Select ($i_e$)") prevents effects of capacitive coupling of the prior art.

For example, with reference to FIG. 4, adjacent rows of byte select transistors are coupled alternately to either an odd byte select line ($i_o$) or an even byte select line ($i_e$). Byte select transistors in odd rows, i.e., a first, second, and third odd byte select transistor, $401_n$-$401_{n+4}$, are coupled to the odd byte select line ($i_o$). Byte select transistors in even rows, i.e., a first, second, and third even byte select transistor, $402_{n+1}$-$402_{n+5}$, are coupled to the even byte select line ($i_e$). Also shown are sense lines, S(n)-S(n+5). If a high voltage is placed on, for example, odd byte select line ($i_o$) and wordline WL (n+2), only the second odd byte select transistor $401_{n+2}$ will conduct. If any parasitic voltage is induced on wordlines or sense lines immediately proximate to wordline WL (n+2) and sense lines S(n+2), namely wordlines WL(n+1) and WL (n+3) and sense lines S(n+1) and S(n+3), no high voltage can be conducted on those wordlines since a voltage on the even byte select line ($i_e$) is driven low (e.g., to ground) while WL(n+2) is high. Sense lines located distally to sense line S(n+2) (e.g., sense lines S(n), S(n+4), S(n+5), etc.) can be allowed to float. Control circuitry or software to maintain appropriate voltage levels (i.e., high, low, or float) can be readily conceived by one of skill in the art.

With reference to FIG. 5, an addressable portion of an exemplary embodiment of a memory array of the present invention is illustrative of how parasitic effects are minimized or eliminated. For example, the first byte select transistor 301 and the first floating gate transistor 303 of FIG. 3 can be conceptualized as being located at a point $b_0$ (not shown explicitly) of row x=1 and column y=1 of FIG. 5. Assuming wordline x=1 is at logic high, byte select ($1_o$) would, when asserted, activate the first byte select transistor 301 and select only a single data byte within column y=1. Thus, rows x=1 and x=3 in column y=1 are selected by byte select ($1_o$), rows x=1 and x=3 in column y=2 are selected by byte select ($2_o$) and so on. In contrast, rows x=2 and x=4 in column y=1 are selected by byte select ($1_e$); rows x=2 and x=4 in column y=2 are selected by byte select ($2_e$). Each column is thus controlled by two byte select lines depending on whether an even or odd row is chosen. Further, a skilled artisan will readily recognize that parasitic coupling between sense lines or wordlines on mirrored columns is effectively minimized or eliminated as well as parasitic coupling between adjacent rows. Thus, data may be reliably erased, programmed, and read without an effect on or from adjacent rows in an array of memory cells.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that additional byte select lines may be added to each column with, of course, a concomitant increase in complexity of control signals. Further, byte select lines may be laid out in various geometries (e.g., at a single side of each column as opposed to a mirrored arrangement) to minimize parasitic coupling between adjacent select lines as well. The specification and drawings are, accordingly, to be regarded in an illustrative rather than a restrictive sense.

What is claimed is:

1. A byte select circuit of a memory cell array, the circuit comprising:
   a first byte select line coupled to a first plurality of memory cells in a first column of the memory cell array; and
   a second byte select line coupled to a second plurality of memory cells in the first column of the memory cell array, the second byte select line being substantially parallel to and capacitively coupled with the first byte select line, the second byte select line further configured to substantially prevent an induced voltage by being driven to a low voltage level when the first byte select line is driven to a high voltage level.

2. The byte select circuit of claim 1 further comprising a third byte select line and a fourth byte select line, the third byte select line and the fourth byte select line each coupled to a second column of the memory cell array, the second column being arranged to physically mirror a layout of the first column such that the first, second, third, and fourth byte select lines are substantially parallel with and in proximity to each other, wherein the fourth byte select line is capacitively coupled with the third byte select line, and the third byte select line is capacitively coupled to the second byte select line.

3. The byte select circuit of claim 1 wherein the first plurality of memory cells and the second plurality of memory cells is each coupled to the first byte select line and the second byte select line respectively through a first byte select transistor and a second byte select transistor.

4. The byte select circuit of claim 3 wherein a gate of the first byte select transistor and the second byte select transistor is each coupled to a separate wordline.

5. A byte select circuit of a memory cell array, the circuit comprising:
   a first byte select line coupled to a first plurality of memory cells in a first column of the memory cell array, the first plurality of memory cells being selectable by a first wordline; and
   a second byte select line coupled to a second plurality of memory cells in the first column of the memory cell array, the second byte select line substantially parallel to and capacitively coupled with the first byte select line, the second plurality of memory cells being selectable by a second wordline, the second byte select line configured to substantially prevent an induced voltage by being driven to a low voltage level, when the first byte select line is driven to a high voltage level.

6. The byte select circuit of claim 5 further comprising a third byte select line and a fourth byte select line, the third byte select line and the fourth byte select line each coupled to a second column of the memory cell array, the second column being arranged to physically mirror a layout of the first column such that the first, second, third, and fourth byte select lines are substantially parallel with and in proximity to each other, wherein the fourth byte select line is capacitively coupled with the third byte select line, and the third byte select line is capacitively coupled to the second byte select line.

7. The byte select circuit of claim 5 further comprising a first sense line coupled to the first byte select line and a second sense line coupled to the second byte select line, the second sense line being configured to float when a voltage is asserted on the first sense line.

8. The byte select circuit of claim 5 wherein any wordlines immediately adjacent to the first wordline are driven to approximately zero volts when a voltage is asserted on the first wordline.

9. The byte select circuit of claim 5 wherein the first plurality of memory cells and the second plurality of memory cells is each coupled to the first byte select line and the second byte select line respectively through a first byte select transistor and a second byte select transistor.

10. The byte select circuit of claim 9 wherein a gate of the first byte select transistor and the second byte select transistor is each coupled to the first wordline and the second wordline respectively.

11. A memory cell array comprising:
   a plurality of columns of memory cells, each of the plurality of columns of memory cells having a plurality of rows of memory cells, the plurality of rows of memory being arranged in even and odd rows;
   a plurality of wordlines arranged in a correspondence with the plurality of rows of memory cells such that each of the plurality of rows of memory cells has a unique wordline from the plurality of wordlines;
   a plurality of even byte select lines arranged such that each of the plurality of even rows of memory cells within a column is coupled to one of the plurality of even byte select lines, each of the plurality of columns having one even byte select line; and
   a plurality of odd byte select lines, each odd byte select line of the plurality of odd byte select lines is capacitively coupled to a set of proximately located even byte select lines of the plurality of even byte select lines, each of the plurality of odd rows of memory cells within a column is coupled to one of the plurality of odd byte select lines, each of the plurality of columns having one odd byte select line, wherein each of the plurality of odd byte select lines is configured to substantially prevent an induced voltage by being driven to a low voltage level when one of the plurality of even byte select lines in a same column is driven to a high voltage level.

12. The memory cell array of claim 11 further comprising a plurality of sense lines arranged in a one-to-one correspondence with the plurality of wordlines, the plurality of sense lines configured such that when a voltage is asserted on a first of the plurality of sense lines, any of the plurality of sense lines not immediately adjacent to the first sense line are allowed to float.

13. The memory cell array of claim 11 wherein any of the plurality of wordlines immediately adjacent to a first wordline are driven to approximately zero volts when a voltage is asserted on the first wordline.

* * * * *